United States Patent [19]

Kogure et al.

[11] Patent Number: 5,250,471
[45] Date of Patent: Oct. 5, 1993

[54] METHOD FOR MANUFACTURING COMPOUND SEMICONDUCTOR DEVICES INCLUDING A STEP WHERE THE SEMICONDUCTOR IS ETCHED WITHOUT EXPOSURE TO LIGHT

[75] Inventors: Kazuo Kogure, Urawa; Masanori Ishii, Sagamihara, both of Japan

[73] Assignees: The Furukawa Electric Co., Tokyo; Fujitsu Limited, Kawasaki, both of Japan

[21] Appl. No.: 453,297

[22] Filed: Dec. 22, 1989

[30] Foreign Application Priority Data

Dec. 26, 1988 [JP] Japan .................. 63-328696

[51] Int. Cl.⁵ .......................... H01L 21/302
[52] U.S. Cl. .................. 437/225; 204/129.5
[58] Field of Search ................ 204/129.5; 437/225

[56] References Cited

U.S. PATENT DOCUMENTS

| | | | |
|---|---|---|---|
| 3,265,599 | 8/1966 | Soonpaa | 204/129.3 |
| 3,706,645 | 12/1972 | Lasser | 204/129.3 |
| 4,386,142 | 5/1983 | Hodes et al. | 204/129.3 |
| 4,414,066 | 11/1983 | Forrest et al. | 204/129.3 |
| 4,415,414 | 11/1983 | Burton et al. | 204/129.3 |
| 4,482,442 | 11/1984 | Kohl et al. | 204/129.3 |
| 4,576,691 | 3/1986 | Kohl et al. | 204/129.3 |

OTHER PUBLICATIONS

"Effect of Photoirradiation of GaAs Surface during HF Treatment", M. Ohno *Journal of the Electrochemical Society*, vol. 131, No. 10, Oct. 1984, Manchester, N.H.

"Kinetics and Morphology of GaAs Etching in Aqueous $CrO_3$-HF Solutions", J. van de Ven, *Journal of the Electrochemical Society*, vol. 133, No. 4, Apr. 1986, Manchester, N.H.

"Reduction of Surface Stacing Faults on N-Type <100> Silicon Wafers", P. W. Koob, *Journal of the Electrochemical Society*, vol. 133, No. 4, Apr. 1986, Manchester, N.H.

"Revealing of defects in InP by shallow (submicron) photoetching", J. L. Weyher, *Journal of Applied Physics*, vol. 58, No. 1, Jul. 1985, Woodbury, New York.

*Primary Examiner*—Brian E. Hearn
*Assistant Examiner*—Linda J. Fleck
*Attorney, Agent, or Firm*—Foely & Lardner

[57] ABSTRACT

A method for manufacturing a compound semiconductor device in which a mixed crystal layer containing a III-V group compound is formed on a substrate, characterized in that when a part of the mixed crystal layer is subjected to etching by an etching liquid, the etching portion is subjected to etching while maintaining the state of not exposing light to the etching portion.

12 Claims, 2 Drawing Sheets

METHOD FOR MANUFACTURING COMPOUND SEMICONDUCTOR DEVICES INCLUDING A STEP WHERE THE SEMICONDUCTOR IS ETCHED WITHOUT EXPOSURE TO LIGHT

BACKGROUND OF THE INVENTION

1. Field of the Invention

The present invention relates to a method for manufacturing compound semiconductor devices, and a compound semiconductor device manufactured through said method.

2. Description of the Prior Art

GaAs and AlGaAs to which attention has been paid as a promising material for compound semiconductors have excellent advantages such that they tend to be high resistance, they can luminesce, etc. Therefore, they are beginning to be used for electronic devices and photodevices such as FET, HEMT, HBT, LD and LED.

Generally, these electronic devices and photodevices are prepared through the steps of stacking a film crystal (a mixed crystal layer) on a substrate crystal, forming a resist pattern on a compound crystal layer, adhering an electrode to the mixed crystal layer after they are formed with a resist pattern, and the like.

A main technique of forming a resist pattern as described above is a lithography method including etching means. As the etching means, a wet type etching method, a dry type etching method and the like are suitably selected.

Among them, the wet type etching method is widely used because the method can be carried out simply using a simple device and damage is not caused to an article subjected to etching treatment. As an etchant, an etching liquid of a fluorine group which is easily cleaned is used in order to prevent the etchant from remaining on the surface of a crystal layer.

In carrying out the wet type etching method, a substrate crystal having a mixed crystal layer, for example, an epitaxial wafer is dipped into an etching liquid within a constant temperature bath for a predetermined period of time within a house illuminated by a white lamp or a yellow lamp.

In the above-mentioned wet type etching method, when a mixed crystal layer such as GaAs, AlGaAs held by a substrate crystal is subjected to etching by the etching liquid of a fluorine group, many conically depressed defects occur on the surface of the mixed crystal layer already subjected to etching.

FIG. 4 and 5 show on an enlarged scale the defects produced in the mixed crystal layer in the epitaxial wafer after etching.

In FIG. 4 and 5, in the epitaxial wafer, reference numeral 1 designates a substrate (crystal) formed of GaAs, 2 a mixed crystal layer (semiinsulating layer) having a thickness of about 1 to 5 $\mu$m formed of AlGaAs, 3 a mixed crystal layer (active layer=conductive layer) having a thickness of about 0.1 to 1 $\mu$m with S doped into GaAs, 4 an etching portion (a portion to which an electrode for wiring is adhered), and 5 a defect.

Such a defect is not found in the mixed crystal layer prior to etching but found in the mixed crystal layer after etching. It can be therefore understood that such a defect occurs as etching takes place.

Experiments revealed that an average occurrence density of the defects amounts to dozens to hundreds per 1 $cm^2$, and a defect to the depth of 3 $\mu$m is sometimes found.

In the present situation in which the aforementioned electronic devices and photodevices are of micron order, when such a defect occurs in the etching portion 4 which is the essential portion of the mixed crystal layers 2 and 3, the contactness and stability (insulating property) between the electrode (metal) for wiring and the mixed crystal layer (semiconductor cannot be fully secured, as a result, the yield of the device decreases due to the incomplete etching technique despite the fact that an excellent material is used.

SUMMARY OF THE INVENTION

In view of the above-described technical problems, the present invention provides a method for manufacturing a compound semiconductor device which can suppress an occurrence of a defect in an etching portion of a mixed crystal layer to enhance a yield of products.

For achieving the intended object of the present invention, the present invention provides a method for manufacturing a compound semiconductor device in which a mixed crystal layer containing a III-V group compound is formed on a substrate, characterized in that when a part of said mixed crystal layer is subjected to etching by an etching liquid, said etching portion is subjected to etching while maintaining a state where the etching portion is exposed to the light.

The method for manufacturing a compound semiconductor device according to the present invention is further characterized by the technical matters which will be mentioned below.

One is that even before etching, the state where the etching portion of the mixed crystal layer is not exposed to the light is maintained.

The other is that an aqueous solution containing fluoride and hydrogen peroxide or an aqueous solution containing hydrogen bromide and hydrogen peroxide is used as an etching liquid.

Another is that as a mixed crystal layer containing a III-V group compound, AlGaAs and/or S doped GaAs and/or InP is used.

The compound semiconductor device according to the present invention is characterized by being manufactured through the aforementioned manufacturing method.

According to the method for manufacturing a compound semiconductor device of the present invention, when a mixed crystal layer was subjected to etching treatment, no defect occurs in an etching portion of the mixed crystal layer.

The reasons contemplated are as follows.

The mixing ratio of the etching liquid (etchant concentration), the temperature of etching liquid and the etching time have the close relation with the etching speed and corrosion amount (etching amount) but are not directly concerned with a mechanism in which defects occur.

However, when natural light, illumination light or the like is incident on the mixed crystal layer during etching, a defect occurs in the mixed crystal layer resulting therefrom.

This probably results from the fact that the energy of light is composed to the etching conditions of the mixed crystal layer to produce photo, electric and chemical-reactions, whereby a defective factor, latent in the mixed crystal layer is actualized.

Accordingly, in the case where the mixed crystal layer is subjected to etching by use of an etching liquid while maintaining the state where light is not irradiated, as in the etching means according to the method of the present invention, it is possible to prevent the occurrence of a defect in the etching portion.

DESCRIPTION OF THE PREFERRED EMBODIMENTS

A method for manufacturing a compound semiconductor device according to the present invention will be described referring to the embodiments shown.

Figure 1:
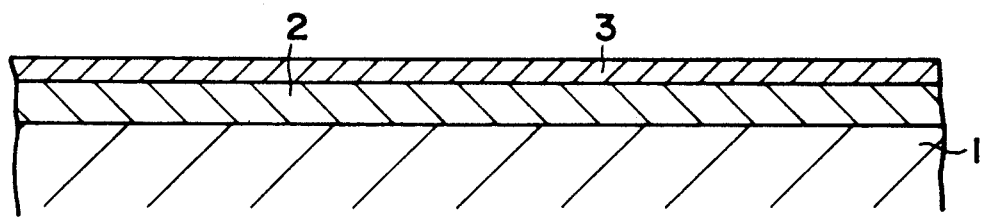
FIG. 1 is a sectional view illustrating a mixed crystal layer prior to etching in the method according to the present invention.

FIG. 1 shows an epitaxial wafer prior to etching. This wafer is the same as that shown in FIGS. 4 and 5 and as described above. A substrate (crystal) 1 is formed thereon with a mixed crystal layer 2 as a semiinsulating layer and a mixed crystal layer 3 as an active layer (conductive layer).

The substrate 1, the mixed crystal layers 2 and 3 are formed from III-V group compound.

As an example, the substrate 1 is formed of GaAs sheet; the mixed crystal layer 2 is formed of AlGaAs layer having a thickness of about 1 to 5 $\mu$m; and the mixed crystal layer 3 formed of S doped GaAs layer having a thickness of about 0.1 to 1 $\mu$m.

As another example, either or both of the mixed crystal layers 2 and 3 are sometimes made of a compound of an InP group.

The aforementioned epitaxial wafer is maintained in the shield state until an etching treatment later described is completed.

Figure 2:
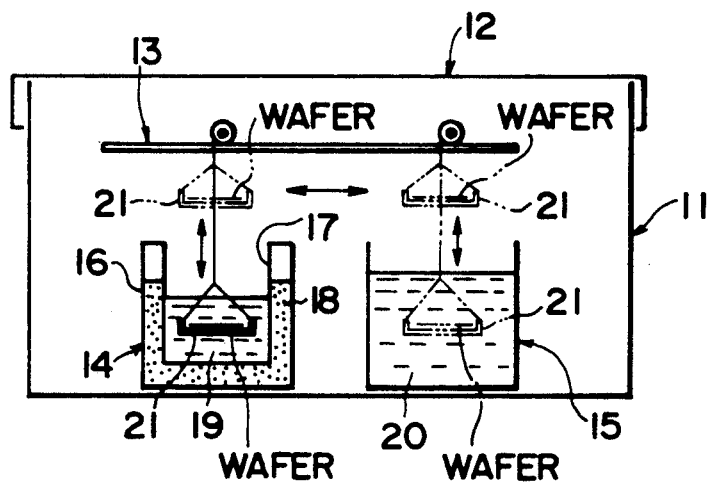
FIG. 2 is a sectional view schematically showing one example of etching means according to the method of the present invention as well as etching equipment.

FIG. 2 shows the etching equipment used in the present invention.

In FIG. 2, an etching box 11 formed of a material having a shielding property is provided with a movable lid 12 on the upper surface thereof and interiorly with a manually or electrically-operated guide machine 13 which is movable in the vertical and horizontal directions.

In FIG. 2, within the etching box 11, a constant temperature vessel 14 and a cleaning vessel 15 are disposed adjacent to each other.

The constant temperature vessel 14 comprises an inner vessel portion 16 and an outer vessel portion 17, between which is interposed a heat transfer member 18.

The inner vessel portion 16 of the constant temperature vessel 14 stores therein an etching liquid 19 of a fluorine group as an etchant.

As the case may be, an etching liquid 19 of a hydrogen bromide group is used.

As the etching liquid 19, other liquids such as acid, alkaline solution and the like can be employed. Thus, as the etching liquid, there can be used those liquids which contain sulfuric acid, nitric acid, hydrochloric acid, acetic acid, ammonium fluoride, sodium hydroxide, etc.

The cleaning vessel 15 stores therein a cleaning liquid 20 formed from pure water, for example. The cleaning vessel 15 is sometimes provided with a shower type cleaner.

In the epitaxial wafer shown in FIG. 1, a predetermined portion of both the mixed crystal layers 2 and 3 on the substrate 1 may be subjected to etching by equipment shown in FIG. 2 in the following procedure.

Other portions except those portions of the mixed crystal layers 2 and 3 to be etched are covered in advance by a resist according to the result pattern forming technique.

This wafer is put into a cassette 21, which is then set in the guide machine 13 within the etching box 11. The cassette 21 with a wafer put therein is held at an upper level of the constant temperature vessel 14.

Thereafter, the guide machine 13 is operated to dip the cassette 21 with the wafer into the inner vessel portion 16 of the constant temperature vessel 14, that is, the etching liquid 19.

When the etching of the mixed crystal layers 2 and 3 has been comprised after lapse of a predetermined time, the guide machine 13 is operated to raise the cassette 21 with the wafer from the etching liquid 19 and at the same time dip the cassette 21 with the wafer into the cleaning liquid 20 within the cleaning vessel 15 to fully wash off the etching liquid remained on the wafer. Then the cassette 21 with the wafer is raised from the cleaning vessel 15 and the lid 12 is opened to remove the wafer together with the cassette 21 from the etching box 14.

Figure 3:
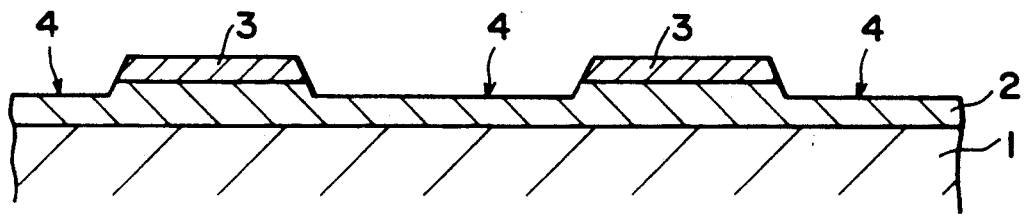
FIG. 3 is a sectional view illustrating a mixed crystal layer after etching by the etching means according to the present invention.
Figure 4:
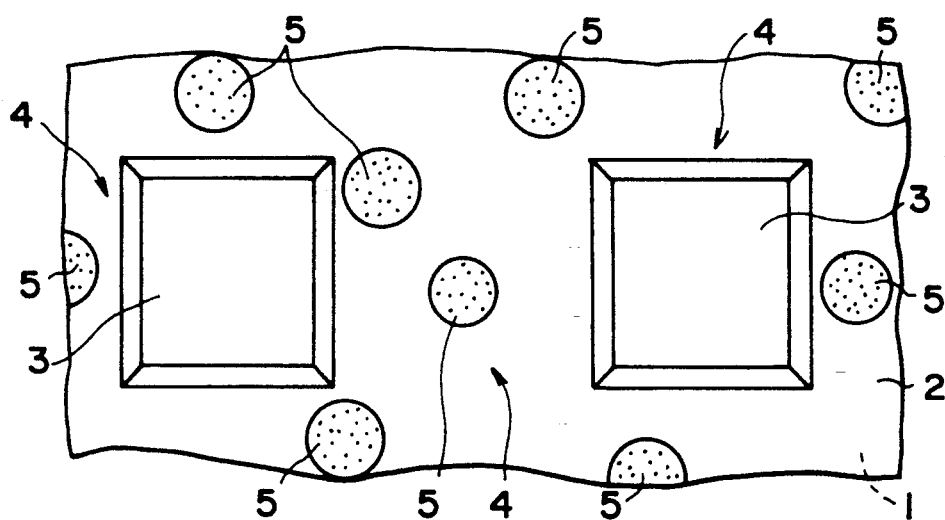
FIGS. 4 and 5 are a top view and a side view, respectively, of a mixed crystal layer subjected to etching by a conventional etching means.
Figure 5:
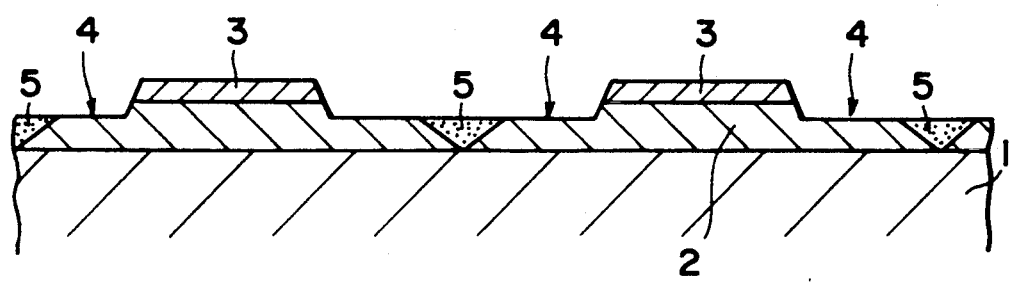

In this manner the mixed crystal layers 2 and 3 subjected to etching are formed with an etching portion 4 as shown in FIG. 3, No defect 5 as mentioned in connection with FIGS. 4 and 5 is found in the etching portion 4.

On the mixed crystal layers 2 and 3 after etching, a source electrode, a drain electrode, a wiring electrode and the like are mounted in place.

Next, experimental examples of the present invention and comparative examples will be described below.

EXPERIMENTAL EXAMPLE 1

In etching by use of the aforementioned means (FIG. 2), a sample was used in which a GaAs layer is formed on a substrate (crystal).

The GaAs layer has a diameter of 2 in. and a thickness of 1.5 $\mu$m.

As the etching liquid, a liquid of a fluorine group in which a mixing ratio of $HF:H_2O:H_2O_2$ is 1:70:3 was used.

HF is a 50% HF solution and $H_2O_2$ is a 30% $H_2O_2$ solution.

When the sample is dipped for 2 minutes and 50 seconds into the aforementioned etching liquid (liquid temperature-20° C.) stored in the constant temperature vessel 14 to subject the GaAs layer to etching, the GaAs layer was shielded so as to avoid light.

By the etching as described above, the GaAs layer was etched at a thickness of 0.5 $\mu$m, and no defect appeared.

COMPARATIVE EXAMPLE 1

The sample (GaAs layer) used in Experimental Example 1 was subjected to etching under the same condition as that of Experimental Example 1 except that a white lamp light was irradiated on the surface of the object for etching.

Approximately 100 pcs/cm² of defects occurred on the GaAs layer after etching.

EXPERIMENTAL EXAMPLE 2

The AlGaAs layer was subjected to etching similarly to Experimental Example 1 except the sample has an AlGaAs layer formed on the substrate (crystal).

By this etching, the AlGaAs layer was etched at a thickness of 0.5 μm. Also in this case, no defects occurred.

COMPARATIVE EXAMPLE 2

The etching was conducted under the same condition as that of Experimental Example 2 for the sample (AlGaAs layer) of Experimental Example 2, except that a white lamp light was irradiated on the surface of the object for etching.

Approximately 150 pcs/cm² of defects occurred in the AlGaAs layer after etching.

EXPERIMENTAL EXAMPLE 3

The AlGaAs layer was etched similarly to Experimental Example 2 except that an etching liquid of a fluorine acid group of which mixing ration of $HF:H_2O:H_2O_2$ was 1:160:3 was used.

By this etching, the AlGaAs layer was etched at a thickness of 0.5 μm. Also in this case, no defects occurred.

COMPARATIVE EXAMPLE 3

The sample (AlGaAs layer) of Experimental Example 3 was subjected to etching under the same condition as that of Experimental Example 3 except that a yellow lamp light was irradiated on the surface of the object for etching.

Approximately 170 pcs/cm² of defects occurred on the AlGaAs layer after etching.

EXPERIMENTAL EXAMPLE 4

In etching by use of the aforementioned means (FIG. 2), a sample was used in which an InP layer was formed on a substrate (crystal).

The InP layer has a diameter of 2 in., and a thickness of 2.0 μm.

An etching liquid with a mixing ratio of $HBr:H_2O:H_2O_2$ was 1:20:4 of a fluorine acid group was used.

$H_2O_2$ is a 30% $H_2O_2$ solution.

When the aforesaid sample is dipped for three minutes into the etching liquid of the hydrogen bromide group stored in the constant temperature vessel (liquid temperature-20° C.) in order to subject to the InP layer to etching, the InP layer was shielded so as to avoid light.

By this etching, the InP layer was etched at a thickness of 0.5 μm. No defects occurred.

COMPARATIVE EXAMPLE 4

The sample (InP layer) of Experimental Example 4 was subjected to etching under the same condition as that of Experimental Example 4 except that a white lamp light was irradiated on the surface of the object for etching.

Approximately 70 pcs/cm² of defects occurred in the InP layer after etching.

As described above, in the Experimental Examples 1 to 4 corresponding to the etching according to the present invention, no defects occurred in etching the GaAs layer, AlGaAs layer and InP layer, whereas in the Comparative Examples 1 to 4 corresponding to prior art method, defects occurred in etching the GaAs layer, AlGaAs layer and InP layer. Therefore, the effectiveness of the method according to the present invention has been proved from the aforementioned examples.

As described above, according to the present invention, a part of the mixed crystal layer is subjected to etching by an etching liquid while maintaining the state of not exposing light to the mixed crystal layer containing a III-V group compound. Therefore, no defects occurred in the etching portion. Accordingly, a compound semiconductor device can be manufactured with good yield.

Moreover, a compound semiconductor device of high quality obtained by the method of the present invention can be used principally to manufacture electronic devices and photodevices having excellent characteristics.

What is claimed is:

1. A method for manufacturing a compound semiconductor device in which a mixed crystal layer containing a III-V group compound is formed on a substrate, characterized in that when an etching portion of said mixed crystal layer is subjected to etching by an etching liquid, said etching portion is subjected to etching while maintaining the state of not exposing light to the etching portion, thereby preventing occurrence of defects.

2. The method according to claim 1, wherein even before etching, the state is maintained where light is not exposed to the etching portion of the mixed crystal layer.

3. The method according to claim 1, wherein the etching liquid comprises an aqueous solution containing fluorine acid and hydrogen peroxide.

4. The method according to claim 1, wherein the etching liquid comprises an aqueous solution containing hydrogen bromide and hydrogen peroxide.

5. The method according to claim 1, wherein the mixed crystal layer comprises AlGaAs.

6. The method according to claim 1, wherein the mixed crystal layer comprises S-doped GaAs.

7. The method according to claim 1, wherein the mixed crystal layer comprises InP.

8. The method according to claim 2, wherein the etching liquid comprises an aqueous solution containing fluorine acid and hydrogen peroxide.

9. The method according to claim 2, wherein the etching liquid comprises an aqueous solution containing hydrogen bromide and hydrogen peroxide.

10. The method according to claim 2, wherein the mixed crystal layer comprises AlGaAs.

11. The method according to claim 2, wherein the mixed crystal layer comprises S-doped GaAs.

12. The method according to claim 2, wherein the mixed crystal layer comprises InP.

* * * * *